Dec. 8, 1964 K. D. KROSSA 3,160,765
ADJUSTABLE CLAMP FOR TRANSISTOR SWITCHING CIRCUITS
Filed Oct. 22, 1962
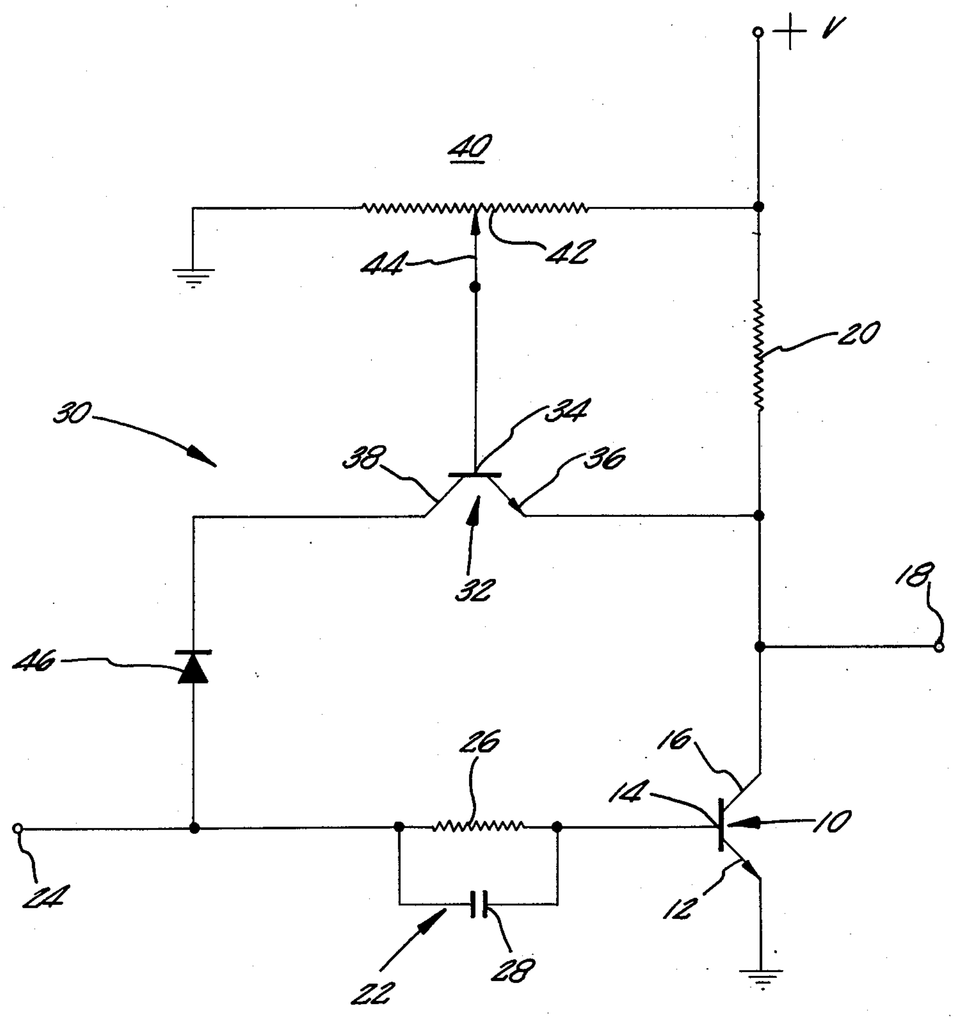
INVENTOR.
KENNETH D. KROSSA
BY
Christie, Parker & Hale
ATTORNEYS 3,160,765
ADJUSTABLE CLAMP FOR TRANSISTOR SWITCHING CIRCUITS

Kenneth D. Krossa, Sierra Madre, Calif., assignor to Burroughs Corporation, Detroit, Mich., a corporation of Michigan Filed Oct. 22, 1962, Ser. No. 232,145
10 Claims. (Cl. 307—88.5)

The present invention relates to transistor switching circuits and more particularly to an improved clamping circuit for limiting the value of the output voltage signal generated by a high speed transistor switching circuit.

In order to combine logical switching operations and signal amplification in single switching units, electronic computer systems and the like employ arrays of common emitter transistor switching circuits. In such arrangements, as in other logical circuits, it is desired that the transistors comprising the switching circuits switch rapidly into and out of conduction to rapidly perform logical operations. To cause the transistors to switch rapidly to a conductive state, relatively large input current signals are applied to the base terminals of the nonconductive transistors. The large input current signals, in addition to rapidly switching the transistors to a conductive state, also tend to drive the transistors into a state of saturation. This is undesired since a saturated transistor builds up a charge in its collector region which must be dissipated before the transistors can become nonconductive, thereby limiting the switching rate of the transistor. In order to allow large input current signals to be applied to the transistors and to prevent the transistors from going into saturation, clamping circuits are employed which limit the collector voltage of the transistors. In particular, the collector voltage is so limited as to maintain a reverse bias on the collector-base junction of the transistors to prevent the transistors from going into saturation.

A circuit arrangement commonly employed to clamp the collector voltage of a transistor switching circuit comprises a diode in series with a voltage source coupled across the collector-emitter circuit of the transistor. In such a configuration, as the transistor becomes conductive in response to an input current signal applied to its base terminal, the voltage at the collector begins to drop. As the collector voltage drops, the clamping diode becomes forward biased to a high conductance state to provide a low impedance current path shunting the emitter-collector circuit of the transistor. The diode clamps the collector voltage at a value determined by the forward voltage drop of the diode and the value of the voltage supplied by the voltage source. By controlling the value of the voltage supplied by the voltage source, the collector voltage is clamped at a voltage which maintains a reverse bias on the collector-base junction to prevent the transistor from going into saturation.

For individually designed and critically controlled circuits such a clamping arrangement is entirely satisfactory and by varying the voltage supplied by the voltage source provides an adjustable clamp for varying the value of the clamped collector voltage. However, in practice, logical switching circuits are constructed on a mass production basis utilizing components having characteristics which satisfy only minimum standards specified by the circuit designer. The actual characteristics of the components may vary from the minimum over a wide range. Thus, for example, a circuit designer may specify a minimum base to collector current gain ($\beta$) for the transistor to be employed in the switching circuit and the actual transistor utilized in the switching circuit may vary from the minimum $\beta$ by a factor of ten or more. In such a case, for a given input signal applied to the base of the transistor, a collector current may be developed which in combination with the clamped collector voltage exceeds the maximum allowed power dissipation of the transistor causing the transistor to burn out. Accordingly, due to the state of the art in manufacturing transistors of given critical characteristics the practical use of the basic clamping circuit is generally limited to singly designed circuits.

A clamping circuit more commonly employed to clamp the collector voltage of the transistor in transistor switching circuits comprises a pair of diodes. One diode is connected in series with the base terminal of the transistor and may be termed the base diode. The other diode is connected between the input terminal of the transistor switching circuit and the collector terminal of the transistor and may be termed the feedback diode. The diodes are poled in a like direction for parallel current flow from the input terminal of the switching circuit. In such a circuit arrangement the transistor is normally nonconducting and the feedback diode is reverse biased. Initially an input current signal applied to the input terminal passes entirely through the base diode to cause the transistor to rapidly become conductive. As the transistor becomes conductive the voltage at the collector terminal begins to drop causing the feedback diode to become forward biased. The forward biased feedback diode clamps the voltage at the collector terminal of the transistor and bleeds off any excess base current from the transistor directly to the collector terminal to prevent large collector current signals from developing which might damage the transistor. The transistor thus remains conducting and out of saturation during the application of the input current signal. The transistor also switches rapidly to a nonconducting state upon the cessation of the input current signal since a charge has not built up in the collector region of the transistor.

In the double diode clamping circuit arrangement the voltage at the collector terminal is fixed by the base voltage of the transistor and the forward voltage drops of the feedback and base diodes. Thus, although the collector voltage is clamped at a value which maintains the transistor out of saturation the collector voltage is not variable. Accordingly, the use of the double diode clamping arrangement is also limited.

In view of the above, the present invention provides an adjustable clamping circuit for transistor switching circuits which allows large input current signals to be applied to the transistor switch to rapidly drive the transistor into a state of conduction and which clamps the collector voltage at levels under the control of an operator to prevent the transistor from going into a state of saturation thereby providing a rapid turn off of the transistor at termination of the input current signal.

Basically, to accomplish this, the clamping circuit arrangement comprises a degenerative feedback circuit connected between the input terminal of the switching circuit and the collector terminal of a switching transistor. The degenerative feedback circuit includes a feedback transistor having an emitter-base circuit and an emitter-collector circuit. The emitter-base circuit is connected between an adjustable source of biasing potential and the collector terminal of the switching transistor for series current flow with the emitter-collector circuit of the switching transistor. The collector terminal of the feedback transistor is coupled to the input terminal to pass a portion of the input current signal through the emitter-collector circuit of the feedback transistor when the feedback transistor is conductive.

In operation, the switching and feedback transistors are normally nonconductive. In response to an input current signal the switching transistor becomes conductive to conduct a current through its emitter-collector circuit. As the switching transistor becomes conductive the collector voltage thereof begins to drop. When the collector voltage reaches a value substantially equal to the value of the voltage supplied by the source of biasing potential minus the potential drop across the emitter-base circuit of the feedback transistor in a conductive state, the feedback transistor becomes conductive to clamp the collector voltage of the switching transistor. In this manner the value of the clamped collector voltage is under the control of the adjustable source of biasing potential. Therefore, by adjusting the source of biasing potential the value of the clamped collector voltage is maintained above a minimum value necessary to reverse bias the collector-base junction and prevent the switching transistor from going into the state of saturation. Also, by adjusting the source of biasing potential the value of the clamped collector voltage may be varied over a wide range above the minimum value.

In addition to clamping the voltage at the collector of the switching transistor, when the feedback transistor becomes conductive a current path is provided through its emitter-collector circuit for a portion of the input current signal. Therefore, the feedback transistor allows a large input current signal to be initially applied to the base of the switching transistor to produce a rapid turn-on of the switching transistor and when conductive provides a current path for bleeding off excess base current to prevent the collector current of the switching transistor from reaching a damaging level.

Accordingly, the adjustable clamping circuit of the present invention provides means for rapidly turning on and off the switching transistor in response to input current signals.

The above, as well as other features of the present invention, may be more clearly understood by reference to the following detailed description when considered with the drawing, the single figure of which is a schematic representation of a preferred form of the present invention.

As illustrated, the switching circuit includes a switching transistor 10 having an emitter-base circuit comprising an emitter terminal 12 and a base terminal 14, and an emitter-collector circuit comprising the emitter terminal 12 and a collector terminal 16 coupled to an output terminal 18 for the switching circuit. By way of illustration only, the transistor 10 is an NPN type transistor and is arranged in a grounded emitter configuration with a load resistor 20 coupled between the collector terminal 16 and a source of positive biasing potential +V and a parallel resistor-capacitor circuit 22 coupled between an input terminal 24 and the base terminal 14. In particular, the paralled circuit 22 comprises a resistor 26 and a capacitor 28 in parallel with each other and in series with the emitter-base circuit of the transistor 10.

Coupled between the input terminal 24 and the collector terminal 16 of the transistor 10 is a degenerative feedback circuit 30. The degenerative feedback circuit 30 includes a feedback transistor 32 having an emitter-base circuit including a base terminal 34 and an emitter terminal 36, and an emitter-collector circuit including the emitter terminal 36 and a collector terminal 38. The transistor 32 possesses a predetermined emitter-base potential when in a conductive state and, by way of example only, is illustrated as being an NPN type transistor arranged in a common base configuration with its emitter terminal 36 connected to the collector terminal 16 of the transistor 10 and its base terminal 34 coupled to an adjustable source of biasing potential illustrated by a potentiometer 40. The potentiometer 40, as illustrated, includes a resistor 42 connected between the source of positive potential +V and ground and a movable arm 44 connected to the base terminal 34 of the transistor 32. In this manner the voltage applied to the base terminal 34 is less than +V and is adjustable by moving the movable arm 44.

To complete the degenerative feedback circuit 30 a unidirectional current conductive device illustrated by the diode 46 is connected between the input terminal 24 and the collector terminal 38 of the transistor 32. As illustrated, the diode 46 has its anode coupled to the input terminal 24 and its cathode coupled to the collector terminal 38. Thus, the diode 46 provides a series current path from the input terminal 24 through the emitter-collector circuit of the transistor 32 when the transistor 32 is conductive.

Due to the source of potential +V and the adjustable voltage source 40, in the absence of an input current signal applied to the input terminal 24, the diode 46 is reverse biased and the transistors 10 and 32 are biased to a nonconductive state. In this state the collector terminal 16 is substantially at +V volts.

When an input current signal is applied to the input terminal 24 it flows entirely through the resistor-capacitor circuit 22 to provide a large base current for the transistor 10 which causes the transistor 10 to become conductive. As the transistor 10 switches to a conductive state, the value of the collector voltage begins to drop. The collector voltage drops until it reaches a value substantially equal to the value of the voltage supplied by the variable voltage source 40 minus the predetermined emitter-base potential for the transistor 32 in a conductive state. When such a collector voltage is reached, the transistor 32 becomes conductive and the potential at the collector terminal 38 drops to forward bias the diode 46. A portion of the input current signal then flows through the diode 46 and the emitter-collector circuit of the transistor 32 to the collector 16 of the transistor 10 to reduce the base current in the transistor 10. At the same time, the voltage at the collector terminal 16 is clamped at a magnitude substantially equal to the value of the voltage supplied by the adjustable voltage source 40 minus the predetermined emitter-base potential of the transistor 32.

By control of the voltage source 40, the voltage at which the collector 16 is clamped is adjustable over a range of voltages above a minimum value which maintains a reverse bias on the collector-base junction of the transistor 10. The maintenance of the collector voltage above the minimum value prevents the transistor 10 from going into a state of saturation irrespective of the magnitude of the input current signal applied to the base 14 of the transistor 10. Accordingly, large input current signals may be applied to the input terminal 28 causing the transistor 10 to rapidly switch to a conductive state without causing the transistor to become saturated.

In the switching circuit thus described, the value of the resistor 26 is preferably chosen such that when the transistors 10 and 32 are conductive, a voltage is developed across the resistor 26 which, together with the voltage drops across the emitter-base circuit of the transistor 10 and the diode 46, is sufficient to maintain a reverse bias on the collector-base junction of the transistor 32. This prevents a build-up of stored charge in the collector region of the transistor 32.

Since the build-up of stored charge in the transistor 32 is limited and the transistor 10 is maintained out of a state of saturation, the transistors 10 and 32 rapidly return to a nonconductive state at the termination of the input current signal, thereby providing for extremely rapid performance of logical switching operations with the switching circuit. In this respect, at the termination of the input current signal, the diode 46 is reverse biased to prevent the possible passage of reverse collector current from the transistor 32 which might maintain the transistor 32 in a conductive state.

Although the present invention has been described as including NPN type of transistors arranged in grounded emitter and common base configurations it is to be understood that PNP type transistors may be employed and that grounded base and common emitter transistor configurations may be included with corresponding changes in the polarity of the biasing potentials without departing from the scope of the present invention.

What is claimed is:

1. A transistor switching circuit, comprising:

a first transistor having an emitter-base circuit, an emitter-collector circuit, and a collector terminal coupled to an output terminal for the switching circuit;

resistance means coupled in series with the emitter-base circuit and to an input terminal for receiving an input signal;

means for biasing the first transistor to a normally nonconductive state to become conductive in response to the input signal applied to the input terminal;

and a degenerative feedback circuit including a second transistor having an emitter-base circuit connected between a source of biasing voltage and the collector terminal of the first transistor for series current flow with the emitter-collector circuit of the first transistor, an emitter-collector circuit, and a collector terminal connected to the input terminal to pass a portion of the input signal through the emitter-collector circuit when the second transistor is conductive, the second transistor having a predetermined emitter-base potential when conductive, and means including a source of biasing voltage for biasing the second transistor to a normally nonconductive state to become conductive in response to the first transistor becoming conductive to clamp the voltage at the output terminal at a voltage determined by the emitter-base potential and the value of the voltage supplied by the source of biasing voltage.

2. In a transistor switching circuit including a first normally nonconductive transistor having an emitter-base circuit, an emitter-collector circuit, and a collector terminal coupled to an output terminal, the transistor being arranged to become conductive in response to an input signal applied to the emitter-base circuit through a resistance means connected in series with the emitter-base circuit and to an input terminal for receiving the input signal, a clamping circuit for limiting the voltage at the output terminal when the first transistor is conductive, comprising:

a second transistor having an emitter-base circuit connected between the collector terminal of the first transistor and a source of biasing voltage for series current flow with the emitter-collector circuit of the first transistor, an emitter-collector circuit, and a collector terminal connected to the input terminal to pass a portion of the input signal through the emitter-collector circuit when the second transistor is conductive, the second transistor, when in a conductive state, having a predetermined emitter-base potential;

and means including the source of biasing voltage for biasing the second transistor to a normally nonconductive state to become conductive in response to the first transistor becoming conductive to clamp the voltage at the output terminal at a value determined by the emitter-base potential and the value of the voltage supplied by the source of biasing voltage.

3. A transistor switching circuit comprising:

a first transistor having an emitter-base circuit, an emitter-collector circuit, and a collector terminal coupled to an output terminal for the switching circuit;

resistance means coupled in series with the emitter-base circuit and to an input terminal for receiving an input signal;

means for biasing the first transistor to a normally nonconductive state to become conductive in response to an input signal applied to the input terminal;

and a degenerative feedback circuit including a source of biasing voltage, a second transistor having an emitter-base circuit connected between the collector terminal of the first transistor and the source of biasing voltage for series current flow with the emitter-collector circuit of the first transistor, an emitter-collector circuit, and a collector terminal connected to the input terminal to pass a portion of the input signal through the emitter-collector circuit when the second transistor is conductive, the second transistor having a predetermined emitter-base potential when in a conductive state, and means including the source of biasing voltage for biasing the second transistor to a normally nonconductive state to become conductive in response to the first transistor becoming conductive to clamp the voltage at the output terminal at a value determined by the emitter-base potential and the value of the voltage supplied by the source of biasing voltage.

4. Apparatus as defined in claim 3 including means for adjusting the value of the voltage supplied by the source of biasing voltage to vary the value of the voltage at the output terminal when the first transistor is conductive.

5. In a transistor switching circuit including a first normally nonconductive transistor having an emitter-base circuit, an emitter-collector circuit, and a collector terminal coupled to an output terminal, the transistor being arranged to become conductive in response to an input signal applied to the emitter-base circuit through a resistance means connected in series with the emitter-base circuit and to an input terminal for receiving the input signal, a clamping circuit for limiting the voltage at the output terminal when the first transistor is conducting, comprising:

an adjustable source of biasing voltage;

a second transistor having an emitter-base circuit connected between the collector of the first transistor and the source of biasing voltage for series current flow with the emitter-collector circuit of the first transistor, an emitter-collector circuit, and a collector terminal connected to the input terminal to pass a portion of the input signal through the emitter-collector circuit when the second transistor is conductive, the second transistor having a predetermined emitter-base potenital when conductive;

and means including the source of biasing voltage for biasing the second transistor to a normally nonconductive state to become conductive in response to the first transistor becoming conductive to clamp the voltage at the output terminal at a value determined by the emitter-base potential and the value of the voltage supplied by the source of biasing voltage.

6. A transistor switching circuit, comprising:

a first transistor having an emitter-base circuit, an emitter-collector circuit, and a collector terminal coupled to an output terminal for the switching circuit;

resistance means coupled in series with the emitter-base circuit and to an input terminal for receiving an input signal;

means for biasing the first transistor to a normally nonconductive state to become conductive in response to the input signal applied to the input terminal;

and a degenerative feedback circuit including a second transistor having an emitter-base circuit connected between the collector terminal of the first transistor and a source of biasing voltage for series current flow with the emitter-collector circuit of the first transistor, an emitter-collector circuit, and a collector terminal, the second transistor having a predetermined emitter-base potential when conductive, a unidirectional current conductive device connected between the input terminal and the collector terminal of the second transistor for series current flow with the emitter-collector circuit of the second transistor to pass a portion of the input signal through the emitter-collector circuit when the second transistor is conductive, and means including the source of biasing voltage for biasing the second transistor to a normally nonconductive state to become conductive in response to the first transistor becoming conductive to clamp the voltage at the output terminal at a value determined by the emitter-base potential and the value of the voltage supplied by the source of biasing potential.

7. Apparatus as defined in claim 6 including means for adjusting the value of the voltage supplied by the source of biasing voltage to vary the value of the voltage at the output terminal when the first transistor is conductive.

8. In a transistor switching circuit, including a first normally nonconductive transistor having an emitter-base circuit, an emitter-collector circuit, and a collector terminal connected to an output terminal, the transistor being arranged to become conductive in response to an input signal applied to the emitter-base circuit through a resistance means connected in series with the emitter-base circuit and to an input terminal for receiving the input signal, a clamping circuit for limiting the voltage at the output terminal when the first transistor is conductive, comprising:

an adjutable source of biasing voltage;

a second transistor having an emitter-base circuit connected between the collector of the first transistor and the source of biasing voltage for series current flow with the emitter-collector circuit of the first transistor, an emitter-collector circuit, and a collector terminal, the second transistor having a predetermined emitter-base potential when in a conductive state;

a unidirectional current conductive device coupled between the input terminal and the collector terminal of the second transistor for series current flow with the emitter-collector circuit of the second transistor to pass a portion of the input signal through the emitter-collector when the second transistor is conductive;

and means including the source of biasing voltage for biasing the second transistor to a normally nonconductive state to become conductive in response to the first transistor becoming conductive to clamp the voltage at the output terminal at a value determined by the emitter-base potential and the value of the voltage supplied by the source of biasing voltage.

9. A transistor switching circuit, comprising:

a first transistor having an emitter-base circuit, an emitter-collector circuit, and a collector terminal coupled to an output terminal for the switching circuit;

resistance means connected between an input terminal and the base of the first transistor in series with the emitter-base circuit of the first transistor;

means connected to the first transistor for biasing the first transistor to a normally nonconductive state to become conductive in response to the input signal applied to the input terminal;

a second transistor having an emitter-base circuit connected between a source of biasing potential and the collector of the first transistor for series current flow with the emitter-collector circuit of the first transistor, an emitter-collector circuit, and a collector terminal, the second transistor having a predetermined emitter-base potential when in a conductive state;

a diode coupled between the input terminal and the collector terminal of the second transistor for series current flow through the emitter-collector circuit of the second transistor when in a conductive state;

and means including the source of biasing potential for normally biasing the second transistor to a nonconductive state to become conductive in response to the first transistor becoming conductive to clamp the voltage at the output terminal at a value determined by the emitter-base potential and the value of the voltage supplied by the source of biasing potential.

10. The apparatus defined in claim 9 wherein the source of biasing potential is adjutable to vary the value of the voltage at the output terminal when the first transistor is conductive.

No references cited.